(12) United States Patent
Buynoski

(10) Patent No.: US 6,552,395 B1
(45) Date of Patent: Apr. 22, 2003

(54) HIGHER THERMAL CONDUCTIVITY GLASS FOR SOI HEAT REMOVAL

(75) Inventor: Matthew S. Buynoski, Palo Alto, CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/476,950

(22) Filed: Jan. 3, 2000

(51) Int. Cl.$^7$ ............................................. H01L 25/265
(52) U.S. Cl. ...................... 257/347; 257/705; 438/455; 148/133.3
(58) Field of Search ........................ 257/43, 347–354, 257/705, 706, 717; 438/149, 479, 517, 455; 148/33.3, 33.6

(56) References Cited

U.S. PATENT DOCUMENTS

| | | | |
|---|---|---|---|
| 5,234,535 A | 8/1993 | Beyer et al. | 156/630 |
| 5,308,594 A | 5/1994 | Chen | 117/222 |
| 5,446,959 A | 9/1995 | Kim et al. | 29/827 |
| 5,463,241 A | 10/1995 | Kubo | 257/376 |
| 5,488,004 A | 1/1996 | Yang | 437/35 |
| 5,567,629 A | 10/1996 | Kubo | 437/24 |
| 5,744,410 A | 4/1998 | Komatsu et al. | 501/97.2 |
| 5,744,865 A | 4/1998 | Jeng et al. | 257/750 |
| 5,770,881 A | 6/1998 | Pelella et al. | 257/347 |
| 5,780,900 A | 7/1998 | Suzuki et al. | 257/335 |
| 5,855,693 A * | 1/1999 | Murari et al. | 148/33.3 |
| 5,874,777 A | 2/1999 | Ohmi et al. | 257/758 |

FOREIGN PATENT DOCUMENTS

WO      WO 91-11822 A    *   8/1991

* cited by examiner

Primary Examiner—John F. Niebling
(74) Attorney, Agent, or Firm—Amin & Turocy, LLP

(57) ABSTRACT

In one embodiment, the present invention relates to a method of forming a silicon-on-insulator substrate, involving the steps of providing a first silicon substrate; forming a beryllium oxide layer over the first silicon substrate, the beryllium oxide layer having one of a first thickness from about 100 Å to about 900 Å and a second thickness from about 1,500 Å to about 3,000 Å; forming a first insulation layer over the beryllium oxide layer to provide a first structure; providing a second structure comprising a second silicon layer and a second insulation layer; bonding the first structure and the second structure together so that the first insulation layer is adjacent the second insulation layer; and removing a portion of the second silicon layer thereby providing the silicon-on-insulator substrate.

12 Claims, 2 Drawing Sheets

HIGHER THERMAL CONDUCTIVITY GLASS FOR SOI HEAT REMOVAL

TECHNICAL FIELD

The present invention generally relates to improved Silicon-on-Insulator devices. More particularly, the present invention relates to methods for removing heat from Silicon-on-Insulator devices and devices having such characteristics.

BACKGROUND ART

Silicon-on-Insulator (SOI) technology is of growing importance in the field of integrated circuits. SOI technology involves forming transistors in a relatively thin layer of semiconductor material overlying a layer of insulating material. More particularly, SOI technology is characterized by the formation of a thin silicon layer (device region) for formation of the active devices over an insulating layer, such as an oxide, which is in turn formed over a substrate. Transistor sources in drains are formed, for example, by implantations into the silicon layer while transistor gates are formed by forming a patterned oxide and conductor layer structure.

Such structures provide a significant gain in performance by having lower parasitic capacitance (due to the insulator layer) and increased drain current due to floating body charging effects (since no connection is made to the channel region and charging of the floating body provides access towards a majority of carriers which dynamically lower the threshold voltage, resulting in increased drain current). Devices, such as metal oxide silicon field effect transistors (MOSFET), have a number of advantages when formed on SOI wafers versus bulk silicon MOS transistors. These advantages include: reduced source/drain capacitance and hence improved speed performance at higher-operating frequencies; reduced $N^+$ to $P^+$ spacing and hence higher packing density due to ease of isolation; absence of latch-up; lower voltage applications; and higher "soft error" upset immunity (i.e., the immunity to the effects of alpha particle strikes).

Although there are significant advantages associated with SOI technology, there are significant disadvantages as well. For example, poor heat removal from devices on an SOI substrate is a significant disadvantage. Electrical devices generate heat, and the inability to remove or dissipate the heat results in poor and/or inconsistent performance of the electrical devices, or even in some instances device and/or substrate degradation.

There is poor heat removal for devices on SOI substrates primarily because of the oxide insulation layer. More specifically, the oxide insulation layer has a markedly lower thermal conductivity than the thermal conductivity of conventional bulk silicon (typically used as semiconductor substrates), which typically surrounds semiconductor devices. For example, the thermal conductivity of silicon dioxide is about 1.4 W/m° C. while the thermal conductivity of conventional bulk silicon is about 150 W/m° C. As a result, the buried oxide layer undesirably insulates thermally the device region in SOI substrates.

In view of the aforementioned disadvantages, there is a need for SOI devices of improved quality, particularly SOI devices having improved heat removal characteristics, and more efficient methods of making such SOI devices.

SUMMARY OF THE INVENTION

As a result of the present invention, an SOI substrate having improved heat removal characteristics (from the device layer) is provided. By forming an SOI substrate according to the present invention, improved performance of devices subsequently formed on the SOI substrate is facilitated. Moreover, forming an SOI substrate in accordance with the present invention does not degrade or deleteriously effect the advantageous properties and characteristics commonly associated with SOI technology (improved speed performance at higher-operating frequencies, higher packing density, absence of latch-up, lower voltage applications, and higher "soft error" upset immunity).

In one embodiment, the present invention relates to a method of forming a silicon-on-insulator substrate, involving the steps of providing a first silicon substrate; forming a beryllium oxide layer over the first silicon substrate, the beryllium oxide layer having one of a first thickness from about 100 Å to about 900 Å and a second thickness from about 1,500 Å to about 3,000 Å; forming a first insulation layer over the beryllium oxide layer to provide a first structure; providing a second structure comprising a second silicon layer and a second insulation layer; bonding the first structure and the second structure together so that the first insulation layer is adjacent the second insulation layer; and removing a portion of the second silicon layer thereby providing the silicon-on-insulator substrate.

In another embodiment, the present invention relates to a method of facilitating heat removal from a device layer of a silicon-on-insulator substrate containing bulk silicon, an insulation layer over the bulk silicon, and a silicon device layer over the insulation layer, involving forming a beryllium oxide layer having one of a first thickness from about 150 Å to about 800 Å and a second thickness from about 1,600 Å to about 2,750 Å between the bulk silicon and the insulation layer.

In yet another embodiment, the present invention relates to a silicon-on-insulator substrate containing a silicon substrate layer; a beryllium oxide layer over the silicon substrate layer; an insulation layer over the beryllium oxide layer; and a silicon device layer comprising silicon over the insulation layer, the beryllium oxide layer having one of a first thickness from about 150 Å to about 800 Å and a second thickness from about 1,600 Å to about 2,750 Å.

DISCLOSURE OF INVENTION

Figure 1:
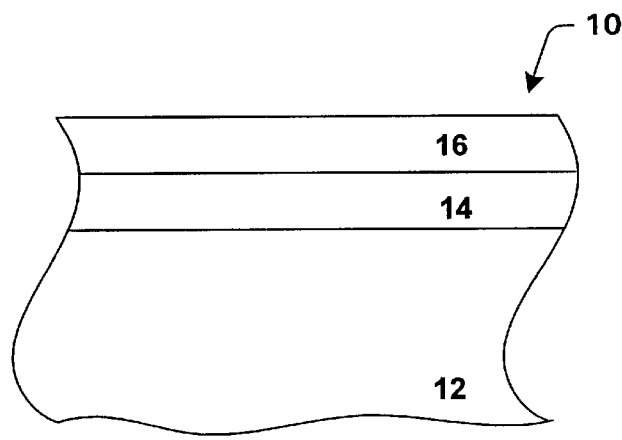
FIG. 1 is a cross-sectional view of a first structure used to make an SOI substrate according to one embodiment of the present invention.

By forming an SOI substrate having improved heat removal characteristics, the performance of devices subsequently formed on the SOI substrate can be substantially improved. While not wishing to be bound to any theory, it is believed that by forming a beryllium oxide layer according to the present invention, it is consequently possible to increase the amount of heat that may be removed (and/or increase the rate at which heat may be removed) from the device layer of the SOI substrate by dissipating the heat through the beryllium oxide layer. Improving the removal of heat from the device layer consequently improves the performance and increases the life of devices, such as MOSFETs, formed on the device layer of the SOI substrate.

The present invention involves positioning a beryllium oxide layer adjacent and below the buried insulation layer of an SOI substrate. In the completed SOI substrate, the beryllium oxide layer acts as a heat spreader/dissipater. The beryllium oxide layer has relatively high thermal conductivity and thus facilitates the transfer of heat away from and/or evenly spreads (preventing local build-up of) heat generated in the device layer of the SOI substrate. Beryllium oxide has a thermal conductivity (about 218 W/m° K.) that is higher than the thermal conductivity of silicon dioxide (about 1.4 W/m° K.), polycrystalline silicon (about 75 to about 125 W/m° K.) and the thermal conductivity of monocrystalline silicon (about 150 W/m° K.).

The beryllium oxide layer, as its name implies, contains beryllium oxide and forms a stable oxide layer that adheres well to bulk silicon and insulator materials (such as silicon dioxide). The thermal conductivity of the beryllium oxide layer is relatively high compared to the thermal conductivity of the insulation layer and bulk silicon. In one embodiment, the thermal conductivity of the beryllium oxide layer is at least 100 times higher than the thermal conductivity of the insulation layer. In another embodiment, the thermal conductivity of the beryllium oxide layer is at least 125 times higher than the thermal conductivity of the insulation layer. In yet another embodiment, the thermal conductivity of the beryllium oxide layer is at least 150 times higher than the thermal conductivity of the insulation layer.

The beryllium oxide layer can be formed to any thickness suitable for facilitating heat removal from the subsequently formed device layer. In one embodiment, generally, the thickness of the beryllium oxide layer is from about 100 Å to about 900 Å, or from about 1,500 Å to about 3,000 Å. In another embodiment, the thickness of the beryllium oxide layer is from about 150 Å to about 800 Å, or from about 1,600 Å to about 2,750 Å. In another embodiment, the thickness of the beryllium oxide layer is from about 200 Å to about 750 Å, or from about 1,750 Å to about 2,500 Å. In one embodiment, the thickness of the beryllium oxide layer is not from 1,000 Å to 1,400 Å. In this connection, improved thermal conductivity results are obtained when the beryllium oxide layer is less than 1,000 Å or more than 1,400 Å.

In one embodiment where the thickness of the beryllium oxide layer is less than about 50% the thickness of the insulation layer, the thickness of the beryllium oxide layer is from about 200 Å to about 900 Å. In another embodiment where the thickness of the beryllium oxide layer is less than about 20% the thickness of the insulation layer, the thickness of the beryllium oxide layer is from about 200 Å to about 800 Å. In one embodiment where the thickness of the beryllium oxide layer is greater than about 300% the thickness of the insulation layer, the thickness of the beryllium oxide layer is from about 1,500 Å to about 3,000 Å. In another embodiment where the thickness of the beryllium oxide layer is greater than about 350% the thickness of the insulation layer, the thickness of the beryllium oxide layer is from about 1,600 Å to about 3,000 Å.

The layer is formed in any suitable manner over the bulk or monocrystalline silicon layer including various deposition techniques. This is accomplished by physical vapor deposition (PVD) and particularly sputtering or chemical vapor deposition (CVD). PVD involves sputtering beryllium followed by oxidizing the sputtered beryllium into beryllium oxide. CVD involves using a gas mixture containing at least one of beryllium, beryllium chloride, beryllium oxide, oxygen containing gases such as oxygen and nitrous oxide, and inert gases such as the noble gases and nitrogen. Such methods are known in the art. After the beryllium oxide layer is deposited on the silicon, an insulation layer is formed thereover using any suitable technique including CVD and wet and dry oxidation processes. This structure containing the beryllium oxide layer is then bonded to a second structure containing an insulation layer on bulk silicon (typically the same structure, but without the beryllium oxide layer). The two structures are fused at the respective insulation layers, and the bulk silicon of the second structure is polished back to a desired thickness to form an SOI substrate. Fusing the two structures is conducted under heat for a suitable period of time. For example, in one embodiment, the two structures are fused at a temperature from about 900° C. to about 1,400° C. for a time from about 20 minutes to about 6 hours. In another embodiment, the two structures are fused at a temperature from about 1,000° C. to about 1,200° C. for a time from about 40 minutes to about 4 hours.

The two structures (the structure containing an insulation layer and the beryllium oxide layer on bulk silicon and the structure containing an insulation layer on bulk silicon) have insulation layers that have similar or different thicknesses. In one embodiment, the two structures have insulation layers that have similar thicknesses (a size within about 5% of each other). In another embodiment, the two structures have insulation layers that have different thicknesses (one thickness is at least about 50% greater in size than other, or one thickness is at least about 100% greater in size than other).

The SOI substrate formed in accordance with the present invention has a bulk or monocrystalline silicon layer, a beryllium oxide layer over the bulk silicon layer, a buried insulation layer over the beryllium oxide layer, and a silicon layer (device layer) over the buried insulation layer. The buried insulation layer typically contains silicon dioxide, although the insulation layer may contain any suitable insulating or oxide material. The buried insulation layer has thickness from about 100 Å to about 5,000 Å. In another embodiment, the buried insulation layer has thickness from about 400 Å to about 4,000 Å. In yet another embodiment, the buried insulation layer has thickness from about 500 Å to about 3,000 Å. The device layer has thickness from about 500 Å to about 5,000 Å. In another embodiment, the device layer has thickness from about 1,000 Å to about 3,000 Å.

In one embodiment of the SOI substrate formed in accordance with the present invention, the beryllium oxide layer has a thickness that is one of less than about 50% of the thickness of the insulation layer and greater than about 300% of the thickness of the insulation layer. In another embodiment, the beryllium oxide layer has a thickness that is one of less than about 20% of the thickness of the insulation layer and greater than about 350% of the thickness of the insulation layer. In some instances, a relatively thin beryllium oxide layer (less than about 50% of the thickness of the insulation layer) or a relatively thick beryllium oxide layer (greater than about 300% of the thickness of the insulation layer) is most effective for dissipating heat.

Referring to FIGS. 1 to 4, a specific example of the present invention is described. Specifically referring to FIG. 1, a first structure 10 is formed. The first structure 10 is a beryllium oxide containing structure. Initially, a bulk silicon substrate or wafer 12 is provided. A beryllium oxide layer 14 is deposited over the bulk silicon substrate 12. In this embodiment, deposited over the bulk silicon substrate 12 using CVD techniques to a thickness of about 700 Å. An insulation layer 16 containing silicon dioxide is then formed over the beryllium oxide layer 14 by CVD techniques. Either low pressure chemical vapor deposition (LPCVD) or plasma enhanced chemical vapor deposition (PECVD) may be employed. In this embodiment, the insulation layer 16 is formed by PECVD using either silane and oxygen or silane and nitrous oxide. The insulation layer 16 has a thickness of about 1,000 Å.

Figure 2:
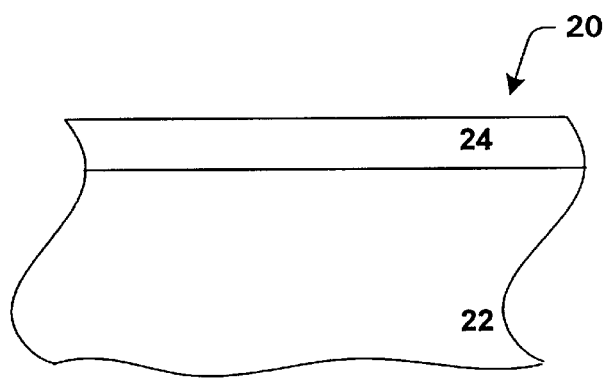
FIG. 2 is cross-sectional view of a second structure used to make an SOI substrate according to one embodiment of the present invention.

Referring to FIG. 2, a second structure 20 is provided. The second structure 20 contains a bulk silicon layer 22 and an insulation layer 24 thereover. In this embodiment, the insulation layer 24 contains silicon dioxide. Also in this embodiment, the thickness of the insulation layer 24 is about 1,000 Å.

Figure 3:
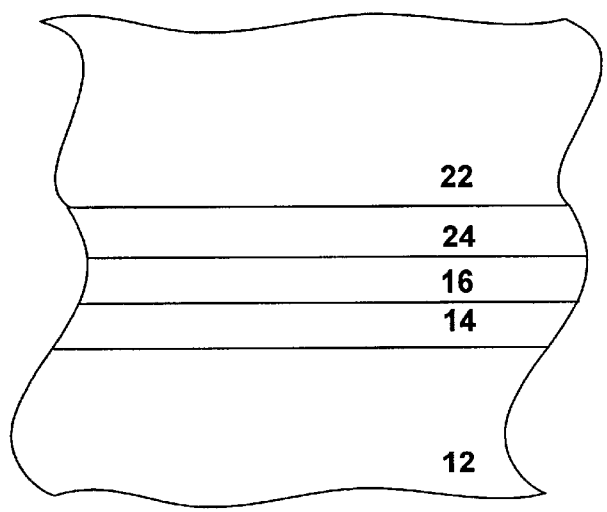
FIG. 3 is cross-sectional view of a bonded structure used to make an SOI substrate according to one embodiment of the present invention.

Referring to FIG. 3, the first structure 10 is bonded to the second structure 20 at the respective insulation layers 16 and 24. The respective insulation layers 16 and 24 are fused by application of heat for a sufficient period of time to bond the first and second structures 10 and 20. For example, the first and second structures 10 and 20 are held together for about 2 hours under a temperature of about 1,100° C.

Figure 4:
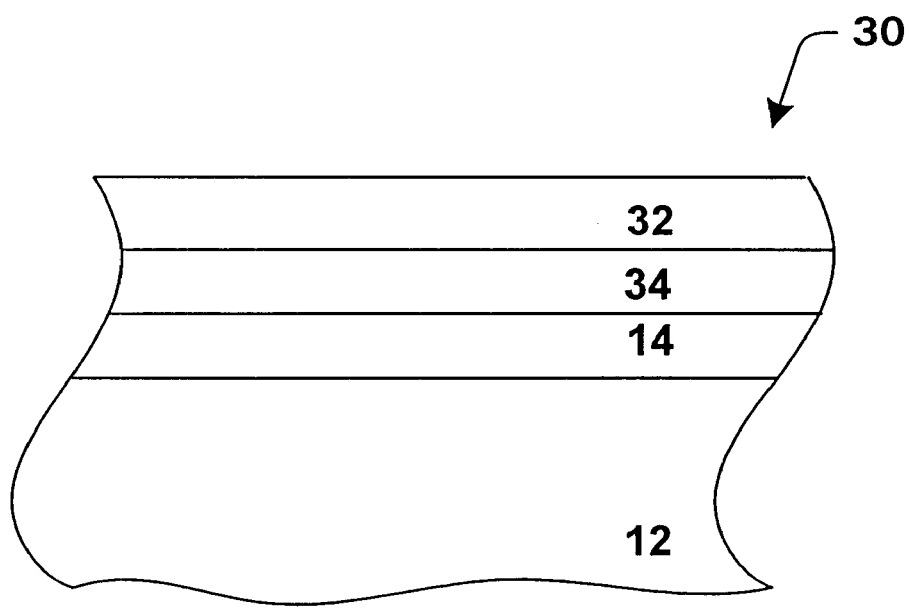
FIG. 4 is cross-sectional view of an SOI substrate according to one embodiment of the present invention.

Referring to FIG. 4, the bulk silicon layer 22 of in FIG. 3 of the second structure 20 is etched to a desired thickness to provide an SOI substrate 30 and specifically a device layer 32. The SOI substrate 30 contains bulk silicon layer 12, beryllium oxide layer 14, buried insulation layer 34, and device layer 32. The thickness of the device layer 32 is about 1,500 Å. The thickness of the insulation layer 34 (formerly the insulation layers 16 and 24) is about 2,000 Å. The thickness of the beryllium oxide layer 14 remains about the same as initially deposited. The beryllium oxide layer 14 has a thickness that is about 35% of the thickness of the insulation layer 34.

The SOI substrate 30 has better heat removal properties due to the presence of the beryllium oxide layer 14. In particular, the high thermal conductivity of beryllium oxide (relative to silicon dioxide) removes heat that may locally accumulate in certain areas (typically near or under devices and/or conductive structures) of the device layer and insulation layer. The high thermal conductivity of beryllium oxide also dissipates heat that may locally accumulate in certain areas of the device layer and insulation layer (or distributes the heat throughout the beryllium oxide layer).

Referring to FIGS. 1 to 4, another specific example of the present invention is described. Specifically referring to FIG. 1, a first structure 10 is formed. The first structure 10 is a beryllium oxide containing structure. Initially, a bulk silicon substrate or wafer 12 is provided. A beryllium oxide layer 14 is deposited over the bulk silicon substrate 12. In this embodiment, beryllium oxide is deposited by CVD techniques over the bulk silicon substrate 12 to a thickness of about 1,800 Å. An insulation layer 16 containing silicon dioxide is then formed over the beryllium oxide layer 14 by CVD techniques. Either low pressure chemical vapor deposition (LPCVD) or plasma enhanced chemical vapor deposition (PECVD) may be employed. In this embodiment, the insulation layer 16 is formed by PECVD using either silane and oxygen or silane and nitrous oxide. The insulation layer 16 has a thickness of about 250 Å.

Referring to FIG. 2, a second structure 20 is provided. The second structure 20 contains a bulk silicon layer 22 and an insulation layer 24 thereover. In this embodiment, the insulation layer 24 contains silicon dioxide. Also in this embodiment, the thickness of the insulation layer 24 is about 250 Å.

Referring to FIG. 3, the first structure 10 is bonded to the second structure 20 at the respective insulation layers 16 and 24. The respective insulation layers 16 and 24 are fused by application of heat for a sufficient period of time to bond the first and second structures 10 and 20. For example, the first and second structures 10 and 20 are held together for about 3 hours under a temperature of about 1,050° C.

Referring to FIG. 4, the bulk silicon layer 22 of in FIG. 3 of the second structure 20 is etched to a desired thickness to provide an SOI substrate 30 and specifically a device layer 32. The SOI substrate 30 contains bulk silicon layer 12, beryllium oxide layer 14, buried insulation layer 34, and device layer 32. The thickness of the device layer 32 is about 2,000 Å. The thickness of the insulation layer 34 (formerly the insulation layers 16 and 24) is about 500 Å. The beryllium oxide layer 14 has a thickness that is about 360% of the thickness of the insulation layer 34.

The SOI substrate 30 has good heat removal properties due to the presence of the beryllium oxide layer 14. In particular, the high thermal conductivity of beryllium oxide (relative to silicon dioxide) removes heat that may locally accumulate in certain areas (typically near or under devices and/or conductive structures) of the device layer and insulation layer. The high thermal conductivity of beryllium oxide also dissipates heat that may locally accumulate in certain areas of the device layer and insulation layer (or distributes the heat throughout the beryllium oxide layer).

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A silicon-on-insulator substrate, comprising:
   a silicon substrate layer;
   a beryllium oxide layer over the silicon substrate layer;
   an insulation layer over the beryllium oxide layer, the insulation layer having a thickness from 2,000 Å to about 5,000 Å; and
   a silicon device layer comprising silicon over the insulation layer,
   the beryllium oxide layer having a thickness from about 1,600 Å to about 2,750 Å.

2. The silicon-on-insulator substrate of claim 1, wherein the insulation layer comprises silicon dioxide.

3. The silicon-on-insulator substrate of claim 1, wherein the device layer has a thickness from about 500 Å to about 5,000 Å.

4. A silicon-on-insulator substrate, comprising:
   a silicon substrate layer;
   a beryllium oxide layer over the silicon substrate layer;

a silicon dioxide layer over the beryllium oxide layer, the silicon dioxide layer having a thickness from 2,000 Å to about 5,000 Å; and a silicon device layer comprising silicon over the silicon dioxide layer, the device layer having a thickness from about 500 Å to about 5,000 Å, the beryllium oxide layer having a thickness from about 1,600 Å to about 2,750 Å.

5. The silicon-on-insulator substrate of claim 4, wherein the device layer has a thickness from about 1,000 Å to about 3,000 Å.

6. A method of forming a silicon-on-insulator substrate, comprising:

providing a first silicon substrate;

forming a beryllium oxide layer over the first silicon substrate, the beryllium oxide layer having a thickness from about 1,600 Å to about 2,750 Å;

forming a first insulation layer over the beryllium oxide layer to provide a first structure;

providing a second structure comprising a second silicon layer and a second insulation layer;

bonding the first structure and the second structure together so that the first insulation layer is adjacent the second insulation layer; and removing a portion of the second silicon layer to provide a silicon device layer comprising silicon having a thickness from about 500 Å to about 5,000 Å thereby providing the silicon-on-insulator substrate.

7. The method of claim 1, wherein the first insulation layer and the second insulation layer have a combined thickness from about 100 Å to about 5,000 Å.

8. The method of claim 1, wherein the beryllium oxide layer is formed using chemical vapor deposition techniques.

9. The method of claim 1, wherein the first insulation layer and the second insulation layer have thicknesses that are within about 5% of each other in size.

10. A method of facilitating heat removal from a device layer of a silicon-on-insulator substrate comprising bulk silicon, an insulation layer having a thickness from 3,000 Å to about 5,000 Å over the bulk silicon, and a silicon device layer comprising silicon over the insulation layer, comprising:

forming a beryllium oxide layer having a thickness from about 1,600 Å to about 2,750 Å between the bulk silicon and the insulation layer.

11. The method of claim 10, wherein the beryllium oxide layer is formed by one of physical vapor deposition and chemical vapor deposition.

12. The method of claim 10, wherein the beryllium oxide layer has a thickness from about 1,750 Å to about 2,500 Å.

* * * * *